US006465084B1

(12) United States Patent
Curcio et al.

(10) Patent No.: US 6,465,084 B1
(45) Date of Patent: Oct. 15, 2002

(54) METHOD AND STRUCTURE FOR PRODUCING Z-AXIS INTERCONNECTION ASSEMBLY OF PRINTED WIRING BOARD ELEMENTS

(75) Inventors: Brian E. Curcio, Binghamton; Donald S. Farquhar, Endicott; Konstantinos I. Papathomas, Endicott; Mark D. Poliks, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/834,281

(22) Filed: Apr. 12, 2001

(51) Int. Cl.$^7$ ................................................. B32B 3/00
(52) U.S. Cl. ..................... 428/209; 174/255; 174/259; 174/261; 174/264; 439/74
(58) Field of Search ................. 439/74, 91; 174/255, 174/261, 264, 259; 428/209

(56) References Cited

U.S. PATENT DOCUMENTS

| | | | | |
|---|---|---|---|---|
| 3,436,819 A | * | 4/1969 | Lunine ........................ 428/901 |
| 3,541,222 A | * | 11/1970 | Parks et al. |
| 3,795,047 A | | 3/1974 | Abolafia et al. .............. 29/625 |
| 3,971,610 A | * | 7/1976 | Buchoff et al. ............. 174/68.5 |
| 4,249,302 A | * | 2/1981 | Crepeau ....................... 428/901 |
| 4,783,722 A | * | 11/1988 | Osaki et al. .............. 174/68.5 |
| 5,092,032 A | | 3/1992 | Murakimi ...................... 29/830 |
| 5,135,606 A | | 8/1992 | Kato et al. ................... 156/631 |
| 5,200,026 A | | 4/1993 | Okabe ........................ 156/651 |
| 5,220,135 A | * | 6/1993 | Kawakami et al. .......... 174/264 |
| 5,322,593 A | | 6/1994 | Hasegawa et al. ........... 156/633 |
| 5,435,480 A | * | 7/1995 | Hart et al. ................ 228/180.1 |
| 5,624,268 A | | 4/1997 | Maeda et al. ................. 439/66 |
| 5,719,354 A | * | 2/1998 | Jester et al. ................. 174/255 |
| 5,819,406 A | | 10/1998 | Yoshizawa et al. ........... 29/877 |
| 5,920,123 A | * | 7/1999 | Moden ........................ 257/774 |
| 5,984,691 A | | 11/1999 | Brodsky et al. .............. 439/66 |
| 6,009,620 A | * | 1/2000 | Bhatt et al. .................... 29/852 |
| 6,013,876 A | * | 1/2000 | Caporizzo .................... 174/262 |
| 6,015,520 A | * | 1/2000 | Appelt et al. ................ 264/104 |
| 6,059,579 A | | 5/2000 | Kresge et al. ................. 439/66 |
| 6,125,531 A | * | 10/2000 | Farquhar et al. .............. 427/97 |
| 6,138,350 A | * | 10/2000 | Bhatt et al. .................. 174/263 |
| 6,222,136 B1 | * | 4/2001 | Appelt et al. ................ 174/254 |
| 6,291,779 B1 | * | 9/2001 | Lubert et al. ................ 174/265 |
| 6,168,442 B1 | * | 10/2001 | Naoi ........................... 439/91 |
| 6,388,204 B1 | * | 5/2002 | Lauffer et al. ............... 428/209 |

OTHER PUBLICATIONS

U.S. application of Appelt et al for "Manufacturing Methods for Printed Circuit Boards and Printed Circuit Boards Made Thereby", Ser. No. 08/968,988 (IBM Docket EN9–97–032).
U.S. application of Lauffer et al for "Composite Laminate Circuit Structure and Methods of Interconnecting the Same" (IBM Docket EN9–99–081).
IBM Technical Disclosure Bulletin, vol. 37, No. 02A, "Improved and Cost–Reduced Interposer for Higher–Risk Processes", Feb., 1994.
"Multi Layer Substrate with Low Coefficient of Thermal Expansion", Kei Nakamura et al, 2000 International Symposium on Microelectronics, pp 235–240.

* cited by examiner

Primary Examiner—Cathy Lam
(74) Attorney, Agent, or Firm—William N. Hogg

(57) ABSTRACT

A method of forming a core for and forming a composite wiring board. The core has an electrically conductive coating on at least one face of a dielectric substrate. At least one opening is formed through the substrate extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

12 Claims, 4 Drawing Sheets

METHOD AND STRUCTURE FOR PRODUCING Z-AXIS INTERCONNECTION ASSEMBLY OF PRINTED WIRING BOARD ELEMENTS

BACKGROUND INFORMATION

Field of the Invention

This invention relates generally to a method and structure for producing a Z-axis interconnection of printed wiring board elements and, more particularly, to a method and structure of providing a printed wiring board formed of a plurality of elements which are laminated together to form a printed wiring board having Z-axis interconnections.

BACKGROUND OF THE INVENTION

Printed wiring boards are conventionally made up of a plurality of individual elements joined together to provide various levels of wiring on the surfaces of the elements and interconnections between the various wiring levels, such interconnection between the various levels often being referred to as Z-axis interconnections. In some conventional techniques for forming such interconnections in the Z-axis, a drilling operation is required after the various elements have been joined together. This requires precise alignment of all of the elements as well as precise drilling of the final structure which creates the possibility of misalignment at least requiring either rework of the board or at most scrapping of the board after it reaches this late assembly stage. Thus, it is desirable to provide elements for forming a printed wiring board and a technique for forming the elements in the printed wiring board which does not require drilling in the final stage but, rather, allows the individual elements to be formed with the components of the Z-axis connection which, when finally joined together, will provide the necessary connection between various layers of metal wiring.

SUMMARY OF THE INVENTION

According to the present invention, a method of forming a core member for a composite wiring board and a method of forming the composite wiring board, as well as the core member of the composite wiring board and the wiring board, are provided. The core member is formed by providing a dielectric substrate having opposite faces and forming an electrically conductive coating on at least one face thereof, preferably by laminating copper on the at least one face. At least one opening is formed through the substrate extending from one face to the other and through each conductive coating. An electrically conductive material is dispensed in each of the openings extending through the conducting coating. At least a portion of the surface of the conductive coating on at least one face is removed to allow a nub of the conductive material to extend above the substrate face and any remaining conductive material to thereby form a core that can be electrically joined face-to-face with a second core member or other circuitized structure. In one embodiment, a second core is then formed in a similar manner and the two cores joined face to face to provide a printed wiring board with electrical interconnections in the Z-axis, i.e. between the circuit traces on opposite faces of the circuit board so formed. In another embodiment, the core is used to join with at least one other circuitized member. The invention also contemplates a core member formed according to this invention and a printed wiring board formed using at least one core member.

DESCRIPTION OF THE PREFERRED EMBODIMENTS

Figure 1:
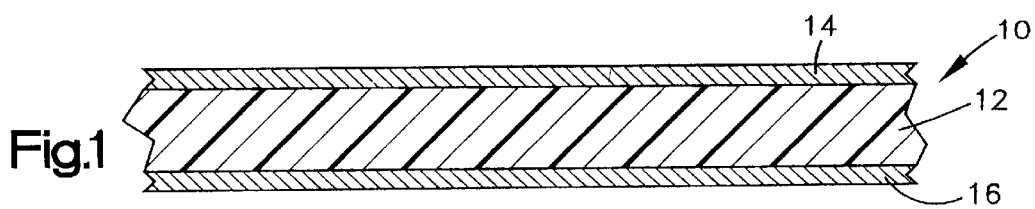
FIGS. 1–6 show a longitudinal, sectional view, somewhat diagrammatic, of the steps to form a core member according to one embodiment of the present invention.

Referring now to the drawings and, for the present, to FIGS. 1–6, the successive steps in forming a core member 10 for use in laminating to another core member to form a printed wiring board according to one embodiment of the invention are shown. As can be seen in FIG. 1, the core member 10 includes a dielectric substrate 12 which has metal coatings 14 and 16 on opposite faces thereof. Dielectric substrate 12 can be any conventional dielectric, such as FR4 (a glass reinforced epoxy), polyimide, polytetrafluroroethylene or other suitable well known dielectrics. In the embodiment shown in FIGS. 1–6, the metal coatings 14 and 16 preferably are copper and, typically, the layer is either one ounce copper (35 um thick) or two ounce copper (70 um thick). However, other thicknesses of copper coatings can be used.

Figure 2:
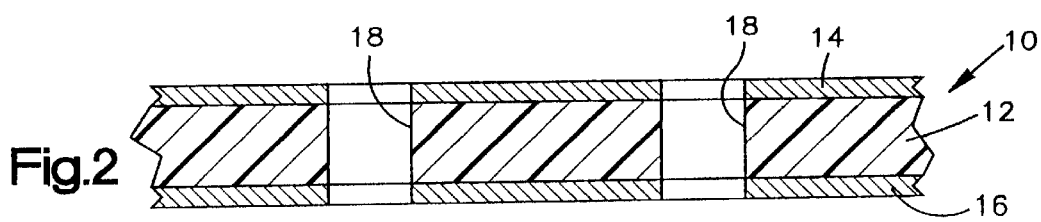
Figure 3:
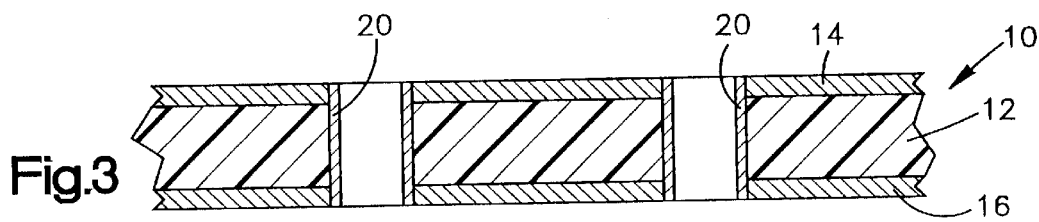

As shown in FIG. 2, a plurality of holes, two of which are shown at 18, are drilled entirely through the substrate 12 and the metal coatings 14 and 16. Optionally, the holes 18 may be plated with a metal 20, as shown in FIG. 3, to provide a conductive path between the coatings 14 and 16. However, with good and complete filling of conductive material, as will be explained presently, the plating 20 may be partially or fully omitted. Plating 20 can be any type of conventional plating to provide the openings with such metal, such as electroless or electrolytic plating.

Figure 4:
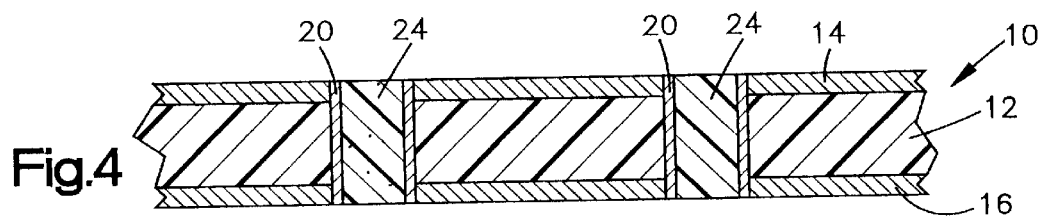

As shown in FIG. 4, the openings 18 are filled with a conductive material 24. Filling can be done by screening, stenciling, flood coating, doctor blading, immersing or injecting. In some case, it may be desirable to heat the adhesive to enhance its flow characteristics and, in some cases, multiple passes might be required to achieve a complete fill of the holes 18. Suitable fill materials include conductive polymers and polymers filled with conductive particles, such as solder, copper particles, silver particles or plated filler particles or mixtures thereof. The polymer can be thermoset or thermoplastic and can be thinned with a solvent if required. A preferred adhesive material 24 is a conductive epoxy sold by the Ablestik Corporation-under the trademark Ablebond 8175 which is a silver filled thermosetting epoxy. Following the filling of the holes as shown in FIG. 4, the epoxy is B-staged, which entails heating the material to a temperature of about 130° C. until the degree of cure of the adhesive is advanced to from about 20% to about 80% of complete cure. As will become apparent later, the fill material 24 should not be fully cured at this state since it will be used to adhere to another conductive epoxy in another core element to form the printed wiring board, all of which will be described presently. If a complete fill of the conductive material results from the filling process, the plating 18 may be omitted. However, plating generally increases the area of contact, increasing reliability and lowering the electrical contact (resistance) and, therefore, is preferred.

It should be noted that if some residue of the adhesive material 24 remains on the surface of the conductive layers 14 or 16 after filling the holes and after it is B-staged, it can be easily removed by chemical or mechanical polishing processes as are well known in the art. It should be noted that, at this point in the processing, no masks have been required for filling the holes so there are no registrations required, and any film material that may accidentally remain on the surface of the metal can be easily removed by polishing or other operations.

Figure 5:
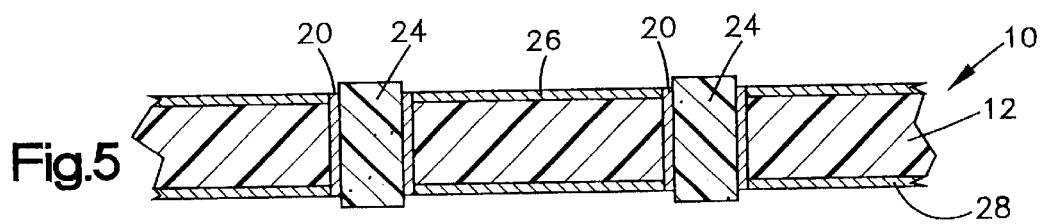

As seen in FIG. 5, layers of material 14 and 16 are partially etched away to form thinned or circuitized conductive surfaces 26 and 28. Such partial etching can be performed by the technique described in U.S. patent application Ser. No. 08/968,988, filed Nov. 12, 1997, for "Printed Circuit Board with Continuous Connective Bumps" (IBM Docket No. EN9-97-032). Thus, this technique of etching around the protrusions 24 by "cold" cupric chloride etching provides the ideal uniform height of the fill material 24 above the etched surfaces 26 and 28 on opposite sides of the dielectric material 12. It is important to note that there are several advantages to the element in the form that it is in, as shown in FIG. 5. The very uniform height of the resulting protrusions of the fill material 24 is a particular advantage. Moreover, there is no fill adhesive residue on the metal surface, and no screening operation is required to form a protruding bump of adhesive.

Figure 6:
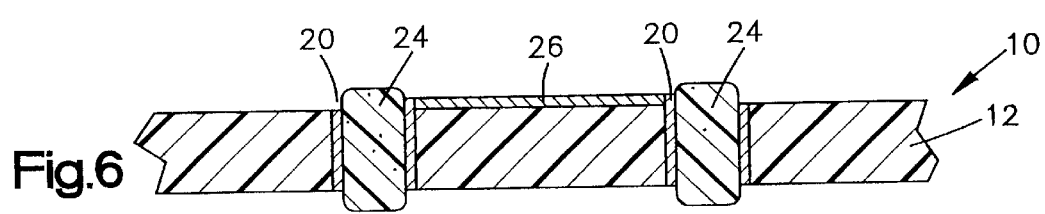

Following the general selective etching of the surfaces 26 and 28, the core is personalized as shown in FIG. 6. In this portion of the personalization, the material 26 connects between the protrusions 24 on one face thereof, whereas the material 28 has been entirely removed from the other face. This personalization preferably is done by known photo-lithographic processes using either positive or negative photoresist materials. At this point, the core element as shown in FIG. 6 is ready to be laminated with at least one other core element to form a printed wiring structure. It is to be understood that several core elements typically will be laminated together but the invention is being illustrated using only two core elements, as shown in FIGS. 7 and 8.

Figure 7:
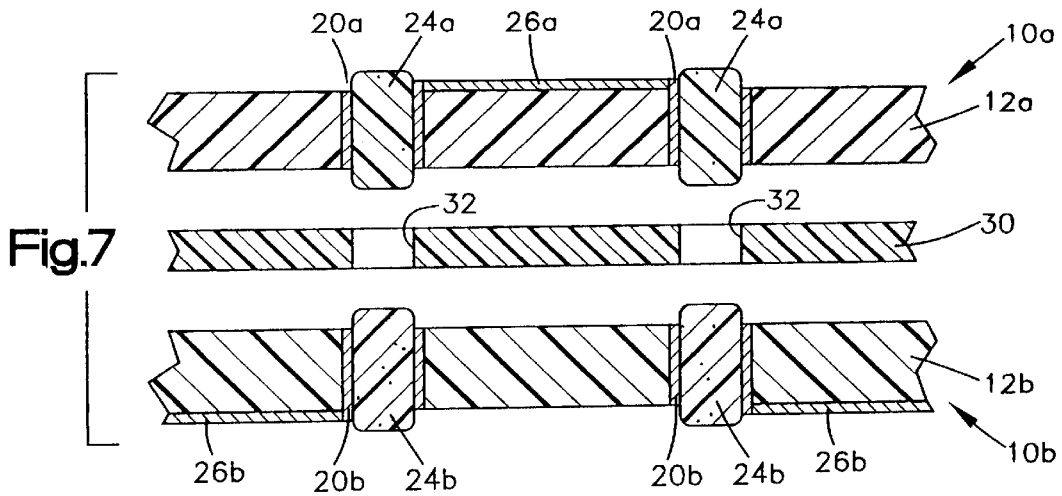
FIGS. 7 and 8 show the steps of laminating two core members together to form a printed wiring board according to one embodiment of the invention.
Figure 8:
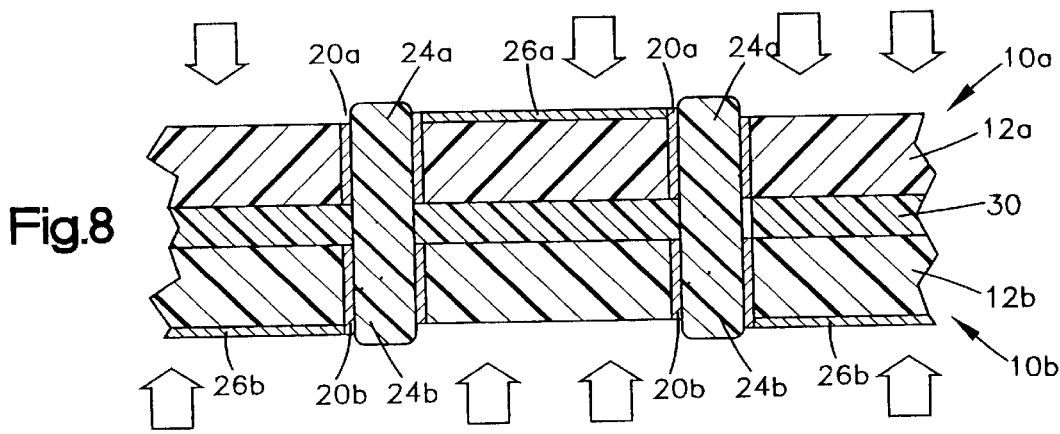
Figure 9:
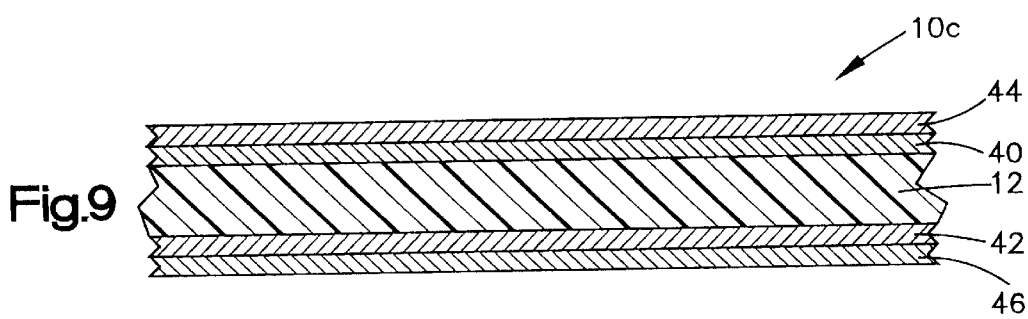
FIG. 9 shows an another starting material for a core member.

As can be seen in FIG. 7, two core elements 10a and 10b are provided which are to be laminated together. It will be noted that the two core elements 10a and 10b are very similar except that the personalization on each of them is slightly different in that on the core element 10a the personalization 26a extends from one fill material 24a to another fill material 24a, whereas on element 10b the personalization 26b extends in opposite directions from each of the fill materials 24b. As seen in FIG. 7, a pre-drilled bonding film 30, such as the film sold under the trademark Pyralux LF by Pyralux Corporation, is interposed between the two cores 10a and 10b. The film 30 has openings 32 drilled therein which are positioned to align with the conductive fill material 24a, 24b in the two core elements 10a and 10b. Heat and pressure are applied as represented by the arrows in FIG. 8 to cause the two core members to bond together, with the Pyralux LF film acting as an adhesive bond material. Also, the fill material 24a and 24b in each of the openings in the two core members 10a and 10b will bond together, as shown in FIG. 8, to form a continuous Z-axis electrical connection between the personalization 26a on the core element 10a and the personalization 26b on the core element 10b. The lamination process also advances the cure of the conductive fill material 24a and 24b past 80% to the fully cured stage. (Alternatively, the film material 30 could be a dry film adhesive which is B-staged and used to laminate the core elements 10a and 10b together.) FIG. 9 shows the starting configuration of a slightly different embodiment for a core element 10c. In this embodiment, the dielectric member 12 is coated with a first metal, such as copper 40 on one face and the same metal 42 on the other face, and a second metal 44 on top of the metal 40, and metal 46 on top of the metal 42, which is different from copper. Then, after drilling and optionally plating the drilled holes and filling the holes with conductive material, the metal 44 and 46 is selectively etched, leaving the metal 40, and which would provide the same configuration as shown in FIG. 5. The metal 44, 46 could be copper, chromium or copper-invar-copper, as well as others, which can be etched by standard etching processes.

Figure 10:
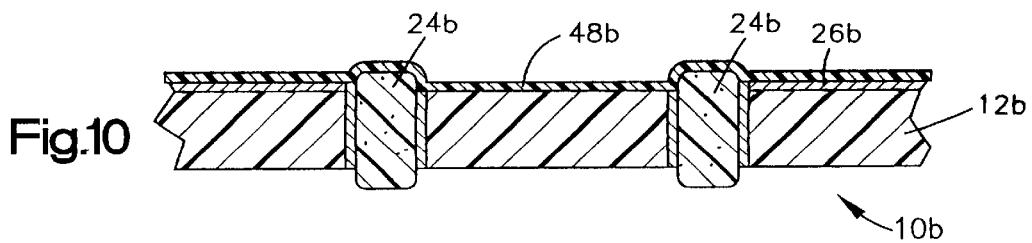
FIGS. 10 and 11 show another technique of forming core members for joining together.
Figure 11:
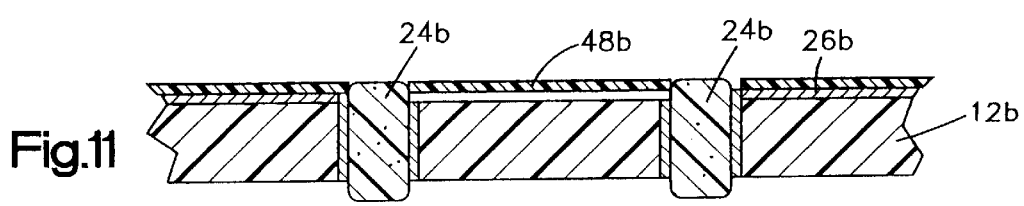
Figure 12:
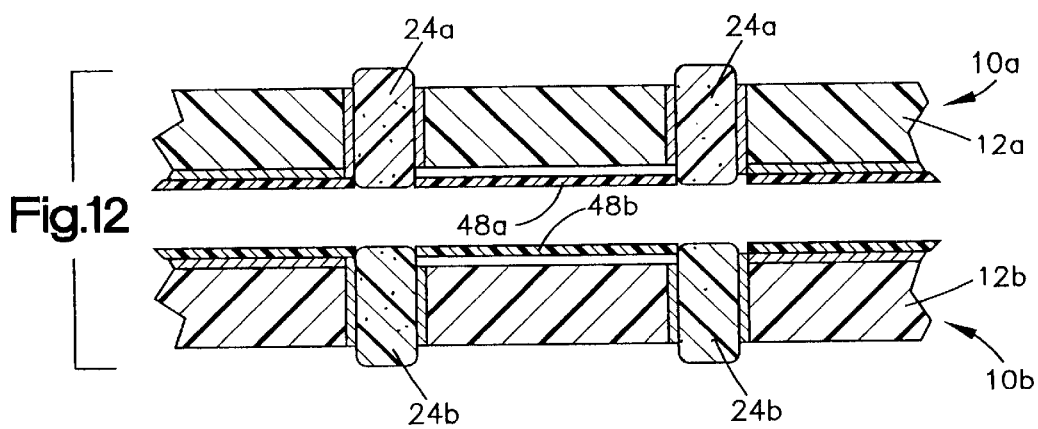
FIGS. 12 and 13 show two core members formed according to the technique shown in FIGS. 10 and 11 joined together.
Figure 13:
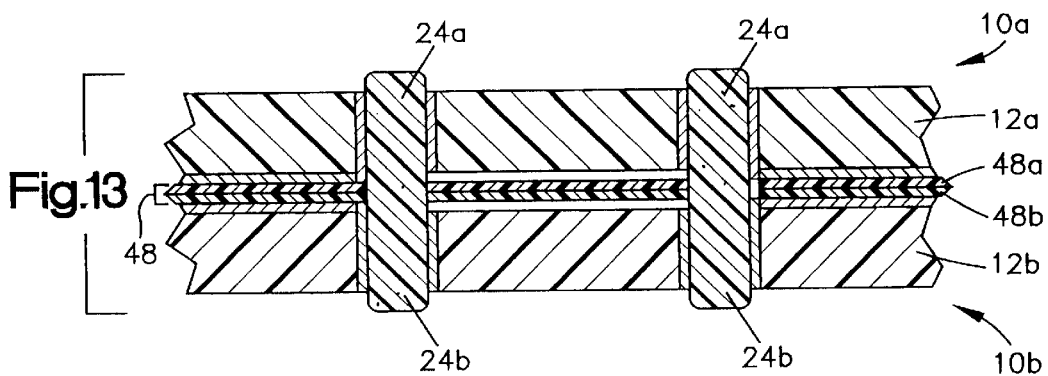

FIGS. 10–14 show another embodiment or technique for joining two core elements together to form a printed wiring board. In this technique, two cores 10a and 10b are provided, but instead of a separate dry film 30 interposed between the two members to form a laminate structure, a dielectric adhesive material 48a and 48b is applied to the face of at least one, and preferably both, of the core elements 10a and 10b. The adhesive material, which is shown, preferably is a thermoset epoxy such as Epoxy 240 sold by the Dexter Corporation. After the epoxy film 48b is coated onto a face, as shown in FIG. 10, it is removed from the surface of the conductive material 24b, as shown in FIG. 11. This is preferably by a planar polishing technique. The same technique is performed on core element 10a. The two core elements 10a and 10b, with the epoxy films 48a and 48b coated thereon, as shown in FIG. 12, are then laminated together as shown in FIG. 13. The laminate structure is very similar to that shown in FIG. 8 with the two epoxy films 48a and 48b fusing together as film 48.

Figure 14:
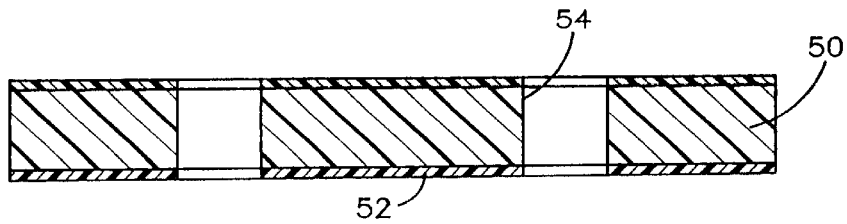
FIG. 14 shows another embodiment of a bonding film.

In still another embodiment, the bonding film 30 takes the form of another multilayer structure, such as a conductive sheet of material 50 having an adhesive coating, such as an epoxy 52 coated thereon, and B-staged, as shown in FIG. 14. The conductive element 50 preferably has holes 54 drilled therein to correspond in location to the conductive fill materials 24a and 24b so that it can be laminated. The epoxy coating 52 on the conductive element 50 can be eliminated in one or more openings 54, thus providing contact with the conductive element 50 by the conductive material 24a, 24b in the cores 10a or 10b (not shown in this Figure).

Figure 15:
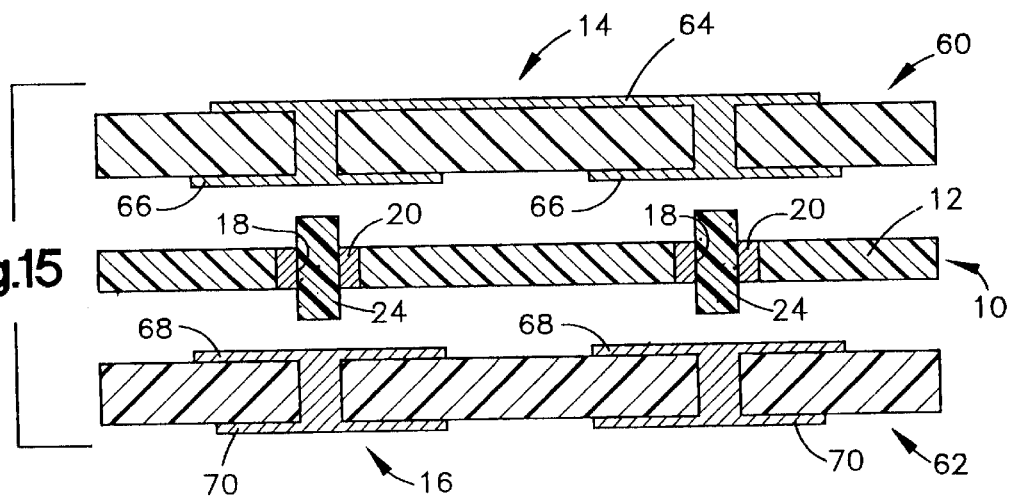
FIGS. 15 and 16 show another embodiment of a core joining two circuitized structures to form a printed wiring board.
Figure 16:
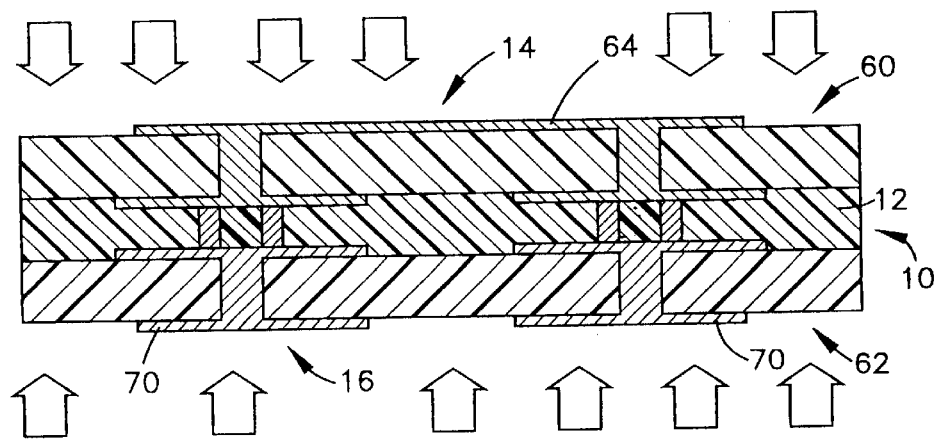

FIGS. 15 and 16 show yet another technique of forming a core member 10 and using the core member to join two circuitized structures to form a printed wiring board. The core member 10 is very similar in construction and technique for forming to that shown in FIGS. 1–6, except that, in this embodiment, all of the metal coatings 14 and 16 on both faces of the substrate are removed so that there is a substrate 12 having holes 18 therein, which holes are plated with conductive metal 20 just as in the embodiments shown in FIGS. 1–6. The conductive material 24 disposed in the holes 18 extends above both faces of the substrate 12. This core 10 is then used to join two additional wiring circuitized structures 60 and 62. These two wiring structures 60 and 62 are formed in a manner very similar to the formation of the core 10 except that, instead of partially removing the metal coatings 14 and 16 to provide thinned coating materials 24 and 26 as with the embodiment shown in FIGS. 1–6, the opposite sides of the core members 60 and 62 are personalized so that the conductive epoxy remains at the same height as the copper coatings 14 and 16. These coatings 14 and 16 are then personalized in the core 60 to provide a circuit trace 64 on one face of the core 60 and a pair of bonding pads 66 on the opposite face of the core 60. On the core 62, the metal coatings 14 and 16 are personalized on opposite faces thereof to form pads 68 on one face of the substrate and pads 70 on the other face.

As shown in FIG. 16, the core 10 is disposed between the two circuitized members 60 and 62, then laminated by heat and pressure as in the previous embodiment. This will provide a printed wiring board structure having continuity between points a and b on one side of the board through the circuitization 64 on the opposite side of the printed wiring board.

It is to be understood, of course, that the hole in the core 10 and in the circuitized structures 60 and 62 may be formed without plating of conductive material thereon, and that the techniques shown in FIGS. 10–13 could be used for joining the core to the circuitized structures 60 and 62.

This invention permits more direct wiring and avoids the need to run additional wiring to a local plated through hole to adjacent layers. Avoiding a plated through hole also permits the connections to be distributed over the XY plane, eliminating concentration of stress and cracks between the plated through hole and the inner planes.

A plated through hole tends to be a rigid structure that connects the top and bottom of the composite to the internal planes. The structure of this invention avoids this and uses materials that are generally more compliant. Data has been recorded that shows enhanced reliability during current induced thermal cycles (CITC) testing. Not only is composite drilling not required as in prior art conventional boards, desmear (to swell and remove drill waste) and plating to form the connections between the layers is eliminated.

While the invention has been described in conjunction with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A composite wiring board comprising:
   at least first and second core members, each core member having opposite bonded faces and remote faces;
   each core member having at least one through opening each extending between said opposite faces;
   conductive traces on at least one face of each of said core members;
   electrically conductive material disposed in each of said openings; and
   said core members being bonded to each other in face to face relationship with a film of bonding adhesive, wherein said film of bonding adhesive is an adhesive coated on a conductive material, with the conductive material in each opening in said first core member being in electrical contact with the conductive material in an opening in said second core member to thereby provide a conductive path between the remote faces of said first and second core members.

2. The invention as defined in claim 1 wherein said electrically conductive material is an electrically conductive adhesive.

3. The invention as defined in claim 1 wherein said electrically conductive is material is a filled thermoset or thermoplastic polymer.

4. The invention as defined in claim 1 wherein said electrically conductive material is a filled polymer.

5. The invention as defined in claim 1 wherein said conductive material is a filled epoxy.

6. The invention as defined in claim 4 wherein said polymer is cured to greater than 80% of complete cure.

7. The invention as defined in claim 1 wherein the conductive traces are on at least the remote ice of said core member and contact the conductive material in said opening.

8. A method of forming a composite wiring board comprising the steps of:
   forming first and second core members each by:
   providing a dielectric subtrate having opposite faces,
   forming an electrically conductive coating on at least one face thereof;
   forming at least one opening through said substrate extending from one face to the other face and through each conductive coating,
   dispensing an electrically conductive material in each of said openings extending through each conductive coating;
   removing at least a portion of surface of the conductive coating on at least one face to thereby allow a nub of the conductive material in at least one of said openings to extend above the surface of said substrate to thereby form a core that can be electrically joined face to face with another structure through said conductive material; and
   joining said first and second core members in face-to-face relationship with a film of bonding adhesive interposed therebetween, said film of bonding adhesive being an adhesive coated on a conductive material, and with the conductive material in each opening in said first core member electrically contacting the conductive material in one of said opening in said second core member.

9. The invention as defined in claim 8 wherein said electrically conductive material is a filled thermoset or thermoplastic polymer.

10. The invention as defined in claim 8 said electrically conductive material is a filled polymer.

11. The invention as defined in claim 8 wherein said conductive material is a filled epoxy.

12. The invention as defined in claim 11 wherein said polymer is cured to more than about 80% of complete cure.

* * * * *